United States Patent [19]

Abuku et al.

[11] Patent Number: 4,870,288
[45] Date of Patent: Sep. 26, 1989

[54] ALIGNMENT METHOD

[75] Inventors: Yuji Abuku, Sagamihara; Mitsuya Sato, Yokohama, both of Japan

[73] Assignee: Canon Kabushiki Kaisha, Tokyo, Japan

[21] Appl. No.: 31,134

[22] Filed: Mar. 30, 1987

[30] Foreign Application Priority Data

Apr. 1, 1986 [JP] Japan .................................. 61-072418
May 27, 1986 [JP] Japan .................................. 61-120260

[51] Int. Cl.⁴ .............................................. G01N 21/86
[52] U.S. Cl. ..................................... 250/548; 364/559; 437/984
[58] Field of Search ......................... 437/984; 364/559; 250/548

[56] References Cited

U.S. PATENT DOCUMENTS 4,720,635 1/1988 Uga ..................................... 250/548

Primary Examiner—Thomas H. Tarcza
Assistant Examiner—David Cain
Attorney, Agent, or Firm—Fitzpatrick, Cella, Harper & Scinto

[57] ABSTRACT

A method of detecting a position of a wafer, including memorizing a pattern of a part of the wafer, comparing a pattern of another part of the wafer at a position which is in a predetermined positional relationship with the first part, with the memorized pattern, and detecting a rotational position of the wafer on the basis of the comparison.

12 Claims, 7 Drawing Sheets

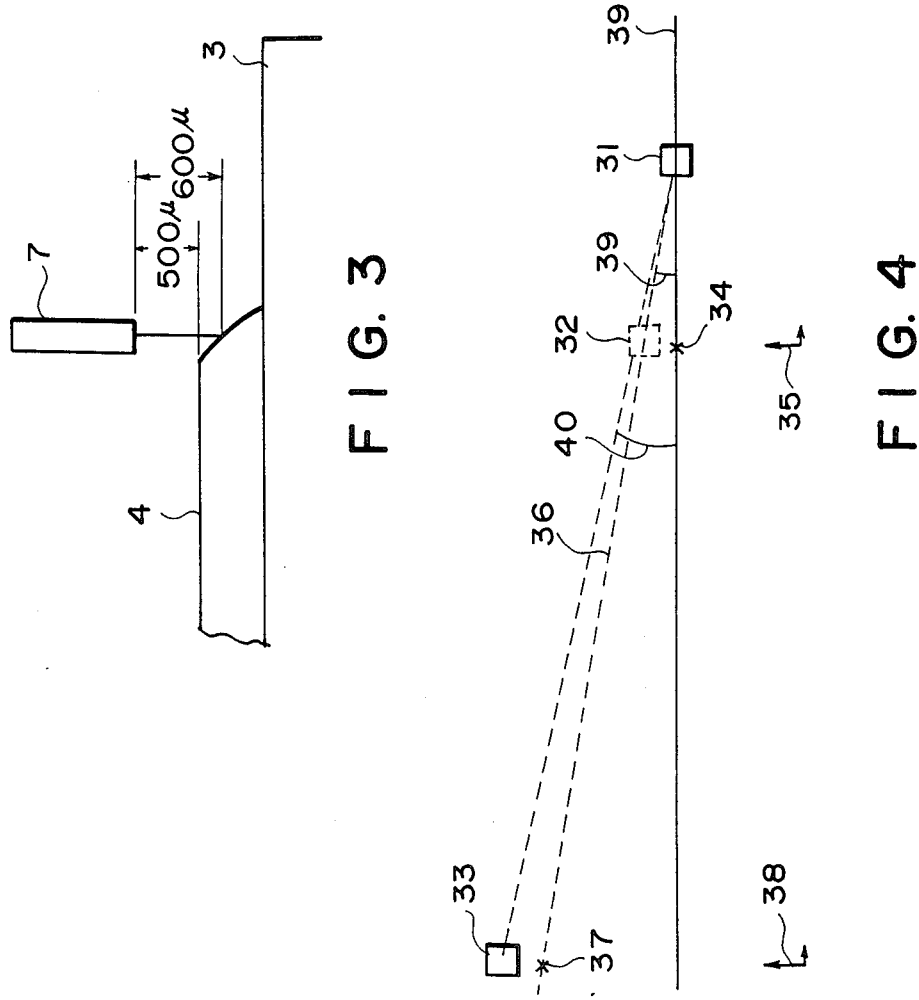

ALIGNMENT METHOD

FIELD OF THE INVENTION AND RELATED ART

The present invention relates to an alignment method, more particularly an alignment method conveniently usable with a prober or the like in a semiconductor inspection system.

An alignment function for a mask (reticle), a wafer or a liquid crystal substrate or the like in a manufacturing or inspecting system for use in production of semiconductor devices and liquid crystal displays particularly the precision of the alignment in the function, influences yield, and the speed of the alignment influences throughput of the manufacturing and inspection. Therefore, the alignment function plays a very important role in the manufacturing and inspection of those devices.

The following description will be made with respect to a prober for a semiconductor devices, as an example of a system to which the present invention is applied.

A prober, generally, includes probe needles which are physically contacted to input or output contacts, which hereinafter will be called "pads", to allow signal transmitting and receiving action with a tester for the purpose of inspecting electrical properties of the semiconductor integrated circuit manufactured on the silicon wafer through wafer processing; and if the test results are not satisfactory, the chip is marked.

On the wafer, there are chips regularly arranged in a matrix, wherein the chips have the same pattern, including the pads. In the probing operation, a probe card is fixed at such a position that all of the probing needles are contactable to the pads. Then, the pads of a first chip are contacted to the probe needles. Then, the chips are sequentially advanced to a position below the probe needles, and are inspected. It should be understood that all of the probe needles are contacted to the respective pads when any of the chips is placed below the probe needles. In order to perform the inspecting operation in a simple manner, it is desirable that the wafer carried on a so-called x-y stage is so positioned that the chips thereon are arranged parallel to the x or y axis. Also, it is desirable to know how the chips are disposed on the wafer in order to assure the contact between the probe needles and all the chips.

Hereinafter, the alignment described above is simply called "alignment". Conventionally, in the apparatus of this type, the first wafer is manually aligned, then some data are memorized after the alignment is accomplished, and thereafter, the next and subsequent wafers are automatically aligned on the basis of the data. The initial manual alignment of the wafer includes $\theta$-alignment, that is, the alignment wherein a wafer is rotated so that the chips thereon are arranged parallel to the x or y axis of an x-y stage on which the wafer is carried.

The $\theta$-alignment is performed in two steps. First, the $\theta$-alignment is roughly effected, by means of an electrostatic capacity sensor or the like detecting a peripheral edge of the wafer having an orientation flat, at a certain position around the wafer periphery. The data obtained from the detection is processed through suitable formulas to determine the center of the wafer and the direction of the orientation flat, on the basis of which the wafer is roughly or coarsely aligned. As an alternative, the wafer is mechanically aligned using the orientation flat directly. Subsequently, a fine $\theta$-alignment is carried out in this manner. The wafer is carried on a chuck movable along a z-axis and rotatable about the z-axis ($\theta$), and the stage is moved in the x-direction, the operator making observation by a microscope and operating a joy stick or the like to rotate the wafer, thus aligning in the $\theta$ direction.

This method is difficult and time consuming for the $\theta$-alignment, since the alignment is carried out while observing by the microscope or the like. Further, the subsequent wafers are aligned with an accuracy which is dependent on the accuracy of the first manual alignment, with the result that the alignment accuracy can vary.

SUMMARY OF THE INVENTION

Accordingly, it is a principal object of the present invention to provide an alignment method for aligning a flat object such as an wafer or the like in a semiconductor devices inspecting system or the like, wherein the first alignment which has conventionally been effected manually, is made automatically to maintain a constant accuracy of alignment and also to reduce the time required for the alignment.

It is another object of the present invention to provide an alignment method wherein a variation of chip size or pitch between chips which may be caused by deformation, e.g., expansion of the wafer, is automatically compensated for.

It is a further object of the present invention to provide a method of template registration, whereby a pattern is registered as a template quickly and with a constant and high accuracy.

It is a further object of the present invention to provide a method of wafer position detection wherein a wafer is correctly positioned using a pattern formed on the wafer and a template, and positions of plural patterns are found quickly and with a high accuracy to determine the position of the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a sectional view of a wafer wherein an edge of the wafer is detected.

FIG. 4 illustrates positions of a camera above a wafer during $\theta$-alignment.

DESCRIPTION OF THE PREFERRED EMBODIMENTS

Figure 1:
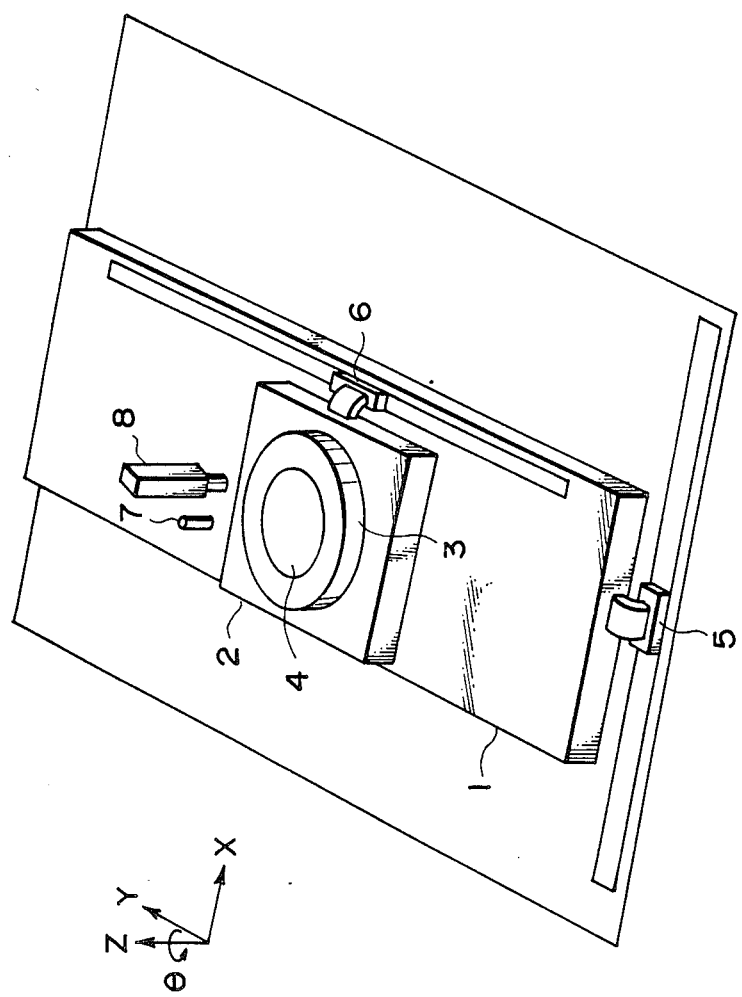
FIG. 1 is a perspective view of an x-y stage of a prober usable with a method according to an embodiment of the present invention.
Figure 2:
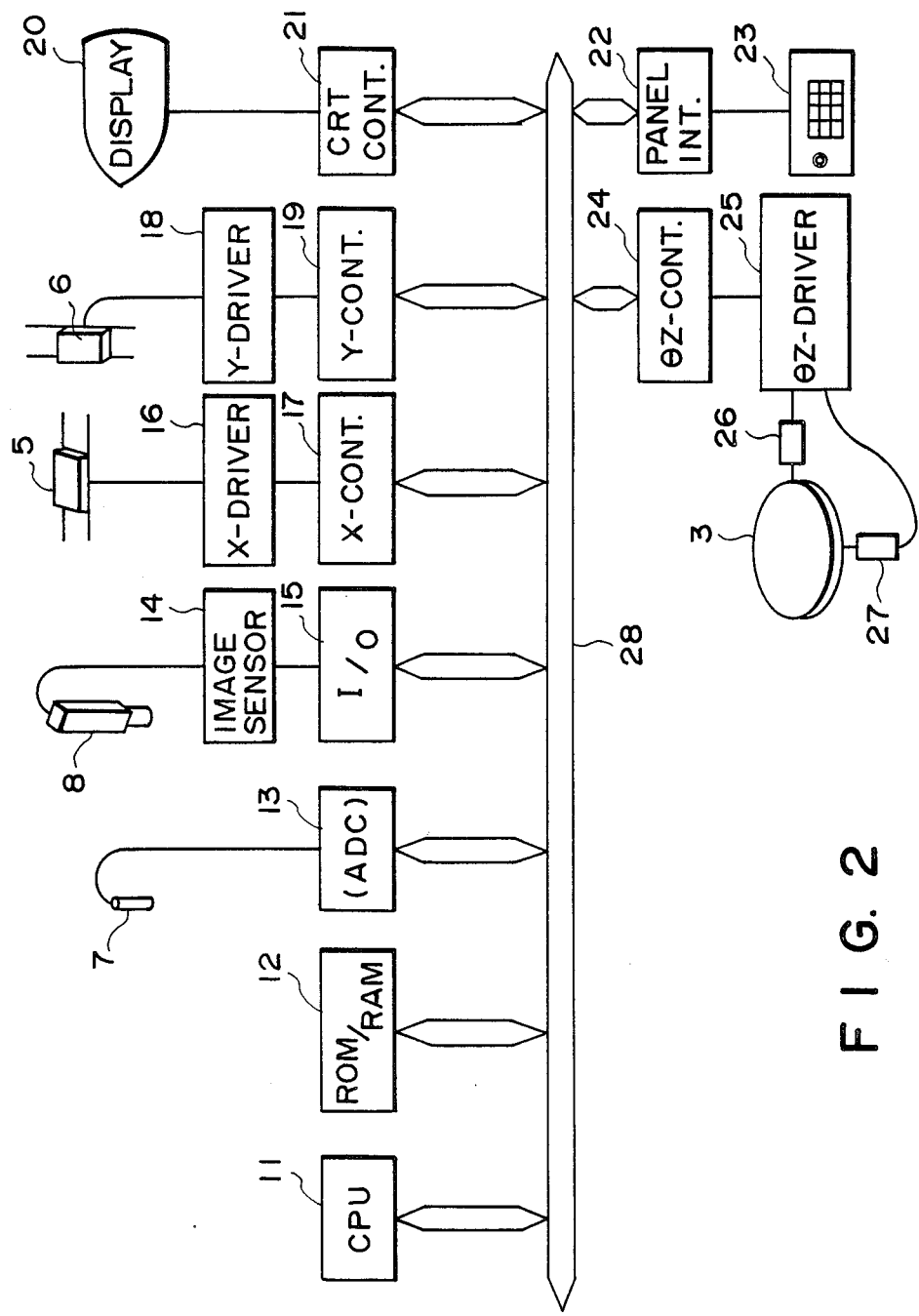
FIG. 2 is a block diagram illustrating a control for an alignment system according to an embodiment of the present invention.

Referring to FIG. 1, there is shown an x–y stage and arrangements therearound of a prober embodying an alignment method according to an embodiment of the present invention. FIG. 2 shows a block diagram of a control system for the prober of this embodiment.

As shown in FIGS. 1 and 2, the prober comprises an x stage 1, a y stage 2 and a chuck 3 for carrying a wafer 4. The x stage 1 is driven by an x-axis linear pulse motor 5, while the y stage 2 is driven by a y-axis linear pulse motor 6. An electrostatic capacity sensor 7 functions to measure a distance from the wafer 4 and to search an edge of the wafer 4. A camera 8 is disposed above the wafer 4 to pick up a pattern on the wafer 4 as image data. The control system includes a CPU for controlling the entire operation of the alignment action, a memory having ROM storing a control programs or the like and RAM using as a working memory, an analog-digital converter (ADC) for converting an output of the electrostatic capacity sensor 7 to digital data, an image recognizing means 14 for comparing the image data picked by the camera 8 with a pre-stored pattern data to produce an output representing a degree of coincidence, and a parallel I/O port 15. The x-axis linear pulse motor 5 is driven by a driver 16 which is controlled by the controller 17. The y-axis linear pulse motor 6 is driven by a driver 18, which is controlled by a controller 19. The control system further comprises a CRT display 20, a CRT controller 21, a panel interface 22, an operation panel 23 provided with a joy stick or the like, a $\theta$-z axis pulse motor controller 24 which controls a driver 25 for the $\theta$-z axis pulse motor, a $\theta$ pulse motor 26 for rotating the chuck 4, a z-axis pulse motor 27 for driving the chuck 4 in z-direction and a bus line 28.

In a rough or coarse $\theta$-alignment operation, the CPU 11 drives the x-axis linear pulse motor 5 and the y-axis linear pulse motor 6 through the x-axis linear pulse motor controller 17, a y-axis linear pulse motor controller 19 and the x-axis linear pulse driver 16 and the y-axis linear pulse driver 18, respectively, in accordance with a control program stored in a memory (ROM) 12, so as to control the x stage 1 and y stage 2 to cause an edge of the wafer 4 passes below the electrostatic capacity sensor 7. Simultaneously, the electrostatic capacity sensor 7 and the A/D converter 13 measure the distance between th electrostatic capacity sensor 7 and the wafer 4, and search the position of the wafer edge.

FIG. 3 shows detection of the wafer edge by the electrostatic capacity sensor 7. In this embodiment, the wafer edge is defined as a position 100 microns below the top surface of the wafer 4. For example, when the distance from the top surface of the wafer 4 and the electrostatic capacity sensor 7 is 500 microns, the wafer edge is detected as the position which is 600 microns away from the electrostatic capacity sensor 7.

In this manner, the wafer edge is determined, and the positions of the x-stage 1 and the y-stage 2 where the wafer edge is determined, is stored in a memory (RAM) 12. The above-described operation is repeated at several different positions around the wafer periphery. Upon completion of the outer periphery detection, the center and the direction of the orientation flat of the wafer 4 are calculated. In response to the detected direction of the orientation flat, the chuck is rotated ($\theta$) to align the direction of the orientation flat.

Subsequently, a fine $\theta$-alignment is performed on the chuck on the stages shown in FIG. 1, similarly to the coarse alignment. In the fine alignment, the camera 8 and the image recognizing means 14 are used. The image recognizing means 14 is of a pattern matching type wherein a pattern represented by 64×64 picture elements is previously memorized from an image field containing 250×240 picture elements. The previously memorized image is compared with a current image, and produces an output representing x and y positions where the degree of coincidence is maximum and produces an output representing the degree of coincidence. On the wafer 4, there are chips having the same pattern regularly in x and y directions. A pattern of a part of one chip exists at a corresponding part of another chip. Therefore, if the wafer 4 is correctly aligned in the $\theta$ direction so that the directions of the scribe lines are aligned with moving directions of the x and y stage 1 and 2, the camera 8 picks up the same pattern or image when the stage 1 and/or 2 is moved in the x and/or y direction through integral multiple(s) of a pitch (index), as long as the camera 8 is not outside the chip area of the wafer 4.

Here, the "pitch" or "index" is a sum of the chip size and the width of one scribe line.

Figure 5:
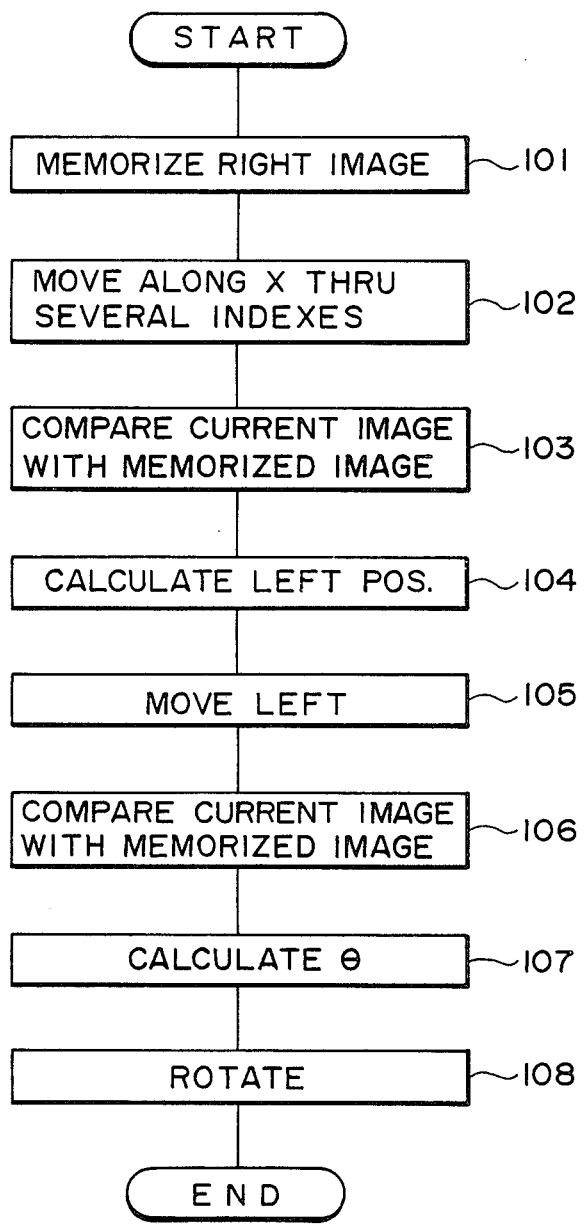
FIG. 5 is a flow chart illustrating steps in the $\theta$-alignment of the wafer.

Referring to FIGS. 4 and 5, wherein FIG. 4 illustrates the principle of alignment, and FIG. 5 is a flow chart illustrating the control, an operation of the fine $\theta$-alignment in the prober shown in FIGS. 1 and 2 will be described.

First, at step 101, the x and y stages 1 and 2 are moved, and a pattern of a chip located at the right side of the wafer 4 is stored in the image recognizing means 14. The coordinates of the position 31 of the memorized pattern is ($X_1$, $Y_1$). Then, at step 102, the x stage 1 is moved in the x-axis direction 39 through integral multiples (M) of the index so that a position 34 of the wafer which is not very far away from the previous position 31 is opposed to the camera 8. At step 103, the image which is now being received by the camera 8 is compared with the previously memorized image or pattern by the image recognizing device 14, by which deviations in ($\Delta x_1$, $\Delta y_1$) are determined in the x and y directions. The amounts of the deviations in the x and y directions are designated by a reference 35 as resolved vectors. Assuming that the wafer 4 is correctly aligned in the $\theta$ direction, the camera 8 receives at the positron 32 of FIG. 4, the same image as that memorized before at the position 31.

The $\theta$-deviation $\theta_1$, which is a rotational deviation between the movement direction 39 of the x stage 1 and the x-axis of the wafer 4, can be calculated from the deviation ($\Delta x_1$, $\Delta y_1$). More particularly, $$\theta_1 = \tan^{-1}(\Delta y_1/(M\Delta i_x + \Delta x_1))$$

where $i_x$ is the index in the x-direction. The direction of the angle $\theta_1$ is indicated in FIG. 4 by a reference numeral 36. That is, the direction of the scribe line of the wafer 4 obtained by the calculation is as shown by the reference numeral 36. In this embodiment, the wafer is not actually rotated through the angle $\theta_1$ at this stage.

At step 104, the x-stage 1 is moved further so that a leftward position from the position 34 in FIG. 4 is opposed to the camera 8 through a calculated amount. The coordinates ($X_2$, $Y_2$) of a target position 37 which is a leftside of the wafer 4, are calculated on the basis of the angle $\theta_1$. In this embodiment, the distance of this further movement from the position 31 and the position 37 is integral (N) multiples of the index $i_x$ in the x-direction. Therefore, the coordinates of the target position ($X_2$, $Y_2$) are:

$$X_2 = N\Delta i_x \cos \theta_1 + X_1$$

$$Y_2 = N\Delta i_x \sin \theta_1 + Y_1$$

At step 105, the x and y stages 1 and 2 are moved so that the position 37 is opposed to the camera 8. At step 106, the image recognizing means 14 compares the image currently received by the camera 8 and the previously memorized image. As a result of the comparison, the deviation ($\Delta x_2$, $\Delta y_2$) is obtained, as designated by a reference 38 as resolved vectors. Here, if the previously calculated deviation angle $\theta_1$ is correct, the camera 8 receives, at the position 33, the same image as that memorized at the position 31.

At step 107, the angular deviation $\theta_2$ is calculated from the deviation ($\Delta x_2$, $\Delta y_2$) between the direction of stage movement 39 and the wafer scribe line, as follows:

$$\theta_2 = \tan^{-1}((Y_2 - Y_1 + \Delta y_2)/(X_2 - X_1 + \Delta x_2))$$

At step 108, the chuck 3 is rotated through the angle $\theta_2$. By this, the direction of the x-stage movement and the direction of the wafer scribe line are aligned.

Figure 6:
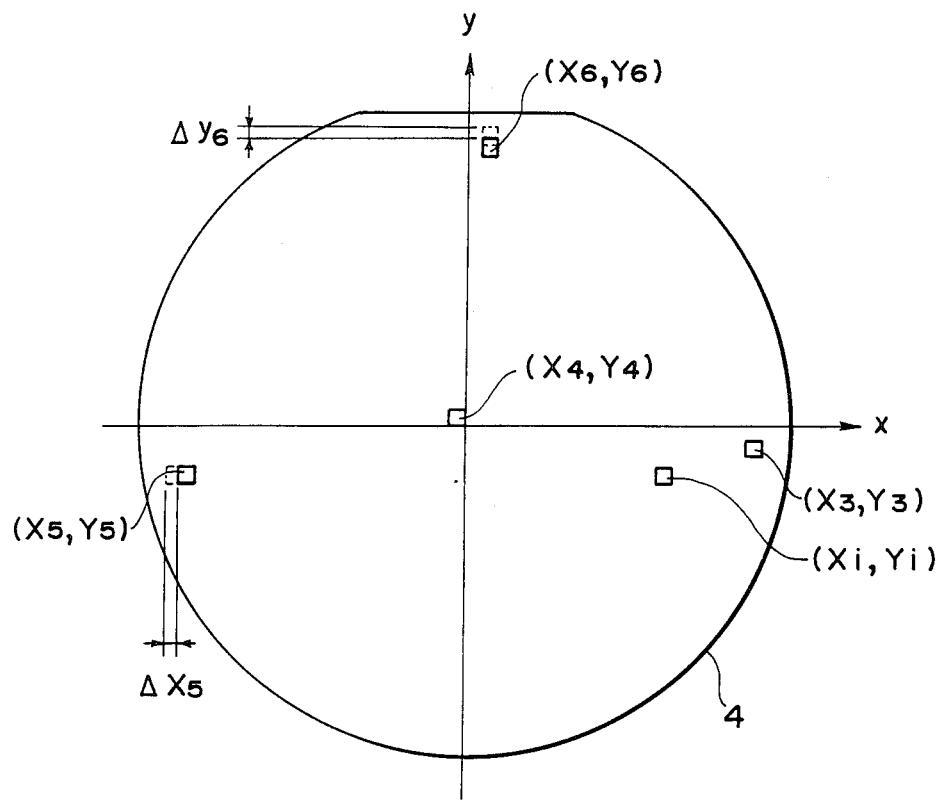
FIG. 6 is a plan view of a wafer showing positions of a camera above the wafer for the purpose of template registration.

Referring to FIG. 6, template registration will be described. When the wafer 4 rotates through the angle $\theta_2$, the coordinates ($X_1$, $Y_1$) where the pattern is memorized during the above described fine $\theta$-alignment, comes to the position having the coordinates ($X_1'$, $Y_1'$). A position ($X_3$, $Y_3$) is the position where the pattern is memorized as a template, and is away from the coordinate position ($X_1'$, $Y_1'$) by an integer multiple or multiples of the index $i_x$ in the x direction and of the index $i_y$ in the y direction. This is to ensure that at the coordinate position ($X_3$, $Y_3$), there is the same pattern as the pattern at the position ($X_1'$, $Y_1'$) which is suitable for the template registration.

The method of the template registration and the correction of index size, will be described referring to FIG. 6. In this embodiment, the template is registered at three different positions, more particularly, one position adjacent the center of the wafer 4 and two marginal positions in the x-direction. However, the pattern is registered as the template only at the firs position, whereas at the other two positions, only the positions where the patterns are the same as the registered pattern are registered.

First, the x and y stages 1 and 2 are moved so that the position ($X_3$, $Y_3$) is opposed to the camera 8, and then, the pattern at that position is memorized by the image recognizing means 14 as a template pattern. Next, the x and y stages 1 and 2 are shifted in the x- and y-directions by integer multiples ($n_4$ in the x direction, and $m_4$ in the y direction) of the indices $i_x$ and $i_y$, respectively, whereby a position ($X_4$, $Y_4$) which is near the center of the wafer 4 is opposed to the camera 8. Here, the image recognizing means 14 compares the pattern currently existing below the camera 8 with the registered template pattern. If the degree of coincidence of the pattern is higher than a predetermined reference level, the coordinates ($X_4$, $Y_4$) are registered as a template registered position. Further, the x stage 1 and the y stage 2 are moved through integer multiples ($n_5-n_4$ in the x direction, and $m_5-m_4$ in the y direction) of the indices $i_x$ and the index $i_y$, respectively, whereby a position ($X_5$, $Y_5$) which is near the left end of the wafer 4 is opposed to the camera 8. Similarly to the position near the center, the image recognizing means 14 compares the pattern at the position ($X_5$ $Y_5$) with the registered template pattern. If the degree of coincidence is higher than the predetermined reference level, the coordinates ($X_5$, $Y_5$) are registered as another template registration position.

After completion of the above described process, the coordinates ($X_3$, $Y_3$), ($X_4$, $Y_4$) and ($X_5$, $Y_5$) are stored in the RAM as template registration positions. Thus, the template registration and the position registration are completed.

The amount of the index or indices can be changed by heat or the like to such an extent that the chip can not be aligned with satisfactory precision during the probing operation. In view of this, it is desirable to make correction to the memorized index or indices. To do this, during the comparison of the coordinates ($X_5$, $Y_5$), the index in the x direction is calculated by $$i_x' = (X_5 - X_3 + \Delta x_5)/n_5$$

where $\Delta x_5$ is the deviation in the x direction produced by the image recognizing means 14. Then, the positions of the template registration positions in the x direction are obtained by $$X_4' = X_3 + n_4 \cdot i_x'$$

$$X_5' = X_5 + \Delta X_5$$

Next, the x and y stages 1 and 2 are moved through integer multiples of the indices $i_x$ and $i_y$, respectively, so that a position ($X_6$, $Y_6$) which is away from the center of the wafer in the y direction is opposed to or below the camera 8. Then, the pattern received by the camera 8 is compared with the registered pattern by the image recognizing means 14, similarly to the above described. If the degree of coincidence is lower than the predetermined reference, the deviation $\Delta Y_6$ in the y direction is determined, and then the index in the y direction is calculated by $$i_y' = (Y_6 - Y_3 + \Delta Y_6)/m_6$$

Then, the positions of the registered position of the template registration in the y direction are calculated by $$Y_4' = Y_4 + m_4 \cdot i_y'$$

$$Y_5' = Y_5 + m_5 \cdot i_y'$$

After completion of the above described process, the coordinates ($X_3$, $Y_3$), ($X_4'$, $Y_4'$) and ($X_5'$, $Y_5'$) are memorized in the RAM as template registration position. Also, the corrected indexes $i_x'$ and $i_y'$ are memorized in the RAM. In this manner, the index is corrected, and the registration positions corrected in response to the index correction are completed. Thus, when the stages 1 and 2 are moved, it is possible to move through a distance calculated on the basis of the corrected index.

Then, the chips o the wafer 4 are sequentially inspected. For the first chip to be inspected, the probe needles are aligned with the pads manually or automatically, wherein the alignment in the x and y directions are effected by moving th x and y stages 1 and 2, while the alignment in the $\theta$ direction is effected by rotating the probe card since the angle θ has been aligned in the manner described above. When the first chip is thus aligned with the probe needles, the distances in the x and y directions from the center of the wafer 4 previously determined and the position of the first chip are memorized. After completion of the inspection for the first chip, the x or y stage 1 or 2 is moved through the amount of the index, whereby the probe needles are to be aligned with the pads of the next chip because of this above described alignment operations. The amount of movement may be the corrected index as described hereinbefore.

After completion of the inspecting operations for all of the chips on the wafer 4, the first wafer is discharged, and the next wafer is introduced onto the wafer chuck.

The description will be made with respect to the wafer alignment for the second and subsequent wafers using the registered template.

Figure 7:
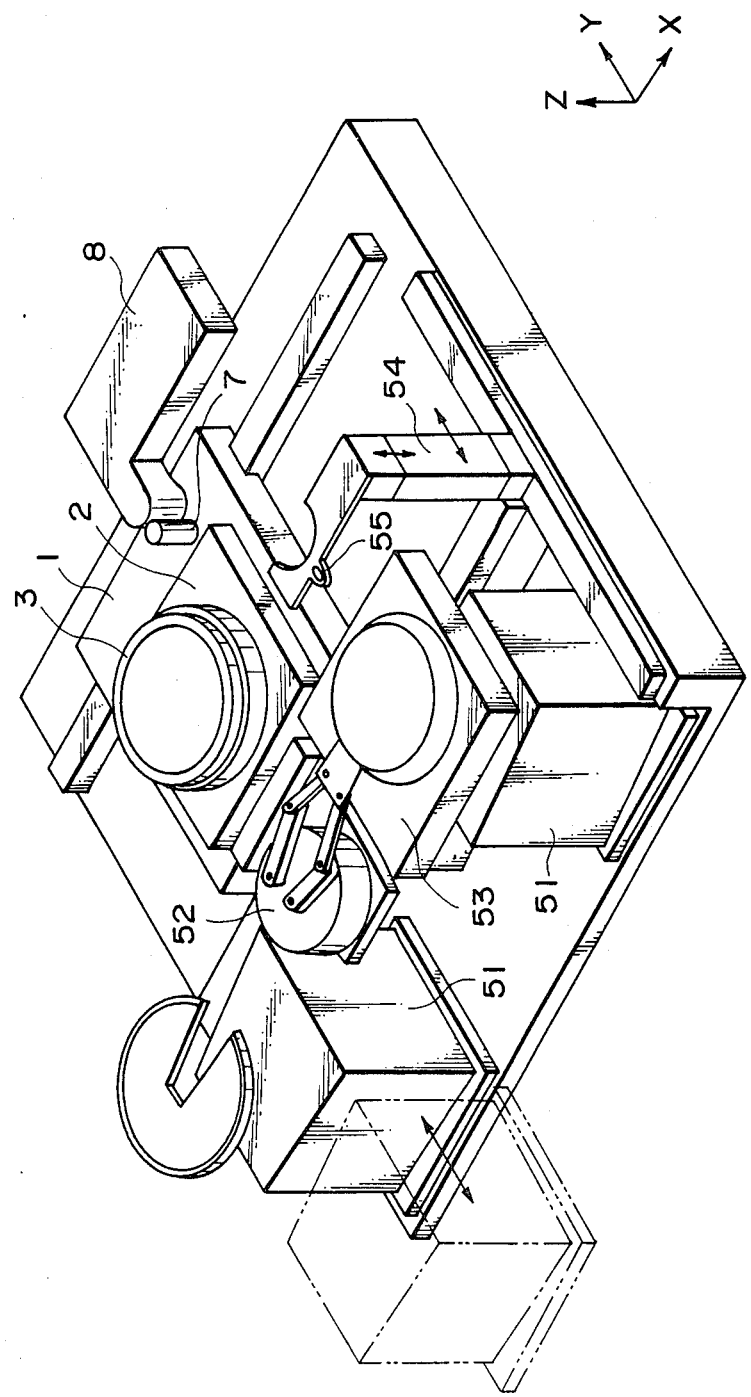
FIG. 7 is a perspective view of a wafer transporting mechanism of the wafer.

Referring to FIG. 7, there is shown a mechanism for transporting the wafer onto the x-y stage.

During the probing operation for the first wafer on the wafer chuck 3, the next wafer is taken out from a wafer carrier 51 by a hand mechanism 52 and is transferred to a pre-alignment station 53.

In the pre-alignment station 53, the wafer is rotated, during which a supply hand 54 is controlled so that a wafer edge sensor 55 on the supply hand 54 always catches the wafer edge, whereby the center of the wafer and the direction of the orientation flat are determined. The deviation of the center is corrected by relocating the wafer on the supply hand 54, while the direction of the orientation flat is corrected by rotating the wafer after the relocation. By the prealignment, the wafer is roughly aligned with respect to the supply hand 54. When the first wafer is returned, after the probing operation, from the wafer chuck 3 to the carrier 51, the next wafer is waiting with the prealignment completed in the pre-alignment station 53. Therefore, the next wafer is transferred onto the wafer chuck 3 without delay which may otherwise result due to the pre-alignment operation. The supply hand 54 transports the next wafer which has been pre-aligned from the pre-alignment station 53 to the wafer chuck 73, after the first wafer is discharged from the wafer chuck 73. Thereafter, the second wafer is subjected to the coarse alignment, similarly to the first wafer. The wafer chuck 3, while carrying thereon the wafer, is moved below the electrostatic capacity sensor 7 by the θ-z axis pulse motor and the x-y stage. At this position, the wafer is scanned in the x and y directions so that the shape of the wafer periphery and the height to the wafer surface are determined.

By the above described operation, the position of the wafer center with respect to the rotational center of the chuck 3 and the direction of the orientational flat are more precisely obtained. The error in the direction of the orientation flat is corrected by actually rotating (θ) the wafer. The error in the wafer center is corrected by correcting amount of movement of the wafer at any time, for example, when it is moved so that a neighborhood of the wafer center is opposed to the camera 8.

Thereafter, the wafer is automatically finely aligned, using the registered template described hereinbefore in connection with the first wafer.

Figure 8:
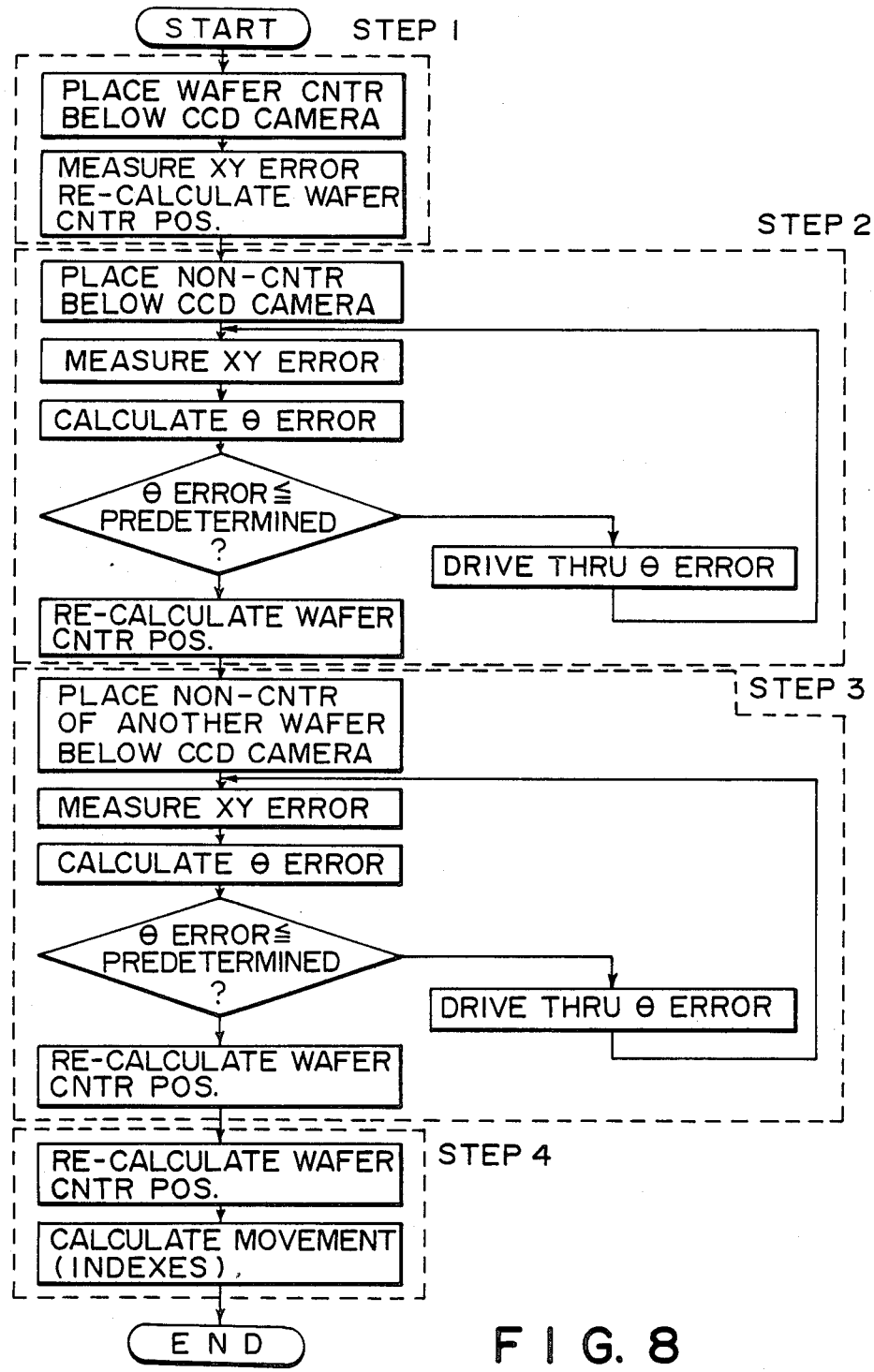
FIG. 8 is a flow chart illustrating steps for positioning second and subsequent wafers.

Referring to FIG. 8, the automatic alignment of this embodiment will be described for the second or the subsequent wafer.

At step 1, adjacent to the center of the wafer 4, a specific pattern which should be present at the position $(X_4, Y_4)$ on the wafer is searched from the image received by the camera (CCD (charge coupled device) camera), through a pattern matching method using the registered template pattern, and the searched position is determined. From the position, the coordinates of the wafer center is calculated, again, with respect to the wafer chuck center.

If, in the image received by the camera, there is no pattern which can be deemed as the same as the registered template pattern, the x-y stage is driven so that the camera receives the image around the periphery of the currently received image, so as to search the registered pattern.

The registered pattern is first searched in the neighborhood of the wafer center, because, if the θ-deviation existing after the pre-alignment by the electrostatic capacity sensor 7 is still large, the part of the wafer having the registered pattern is possibly not within the field of the CCD camera.

At step 2, the x-y stage is driven in an attempt to oppose the position $(X_3, Y_3)$ near the periphery of the wafer to the camera, using the coordinates of the wafer center which have been obtained from the above operation adjacent to the wafer center.

At this position, the registered pattern is searched in the image received by the camera, and the θ-deviation (angular deviation) of the wafer 4 is determined. The wafer chuck is driven to correct the θ-deviation, and then the position of the registered pattern is measured. This is repeated until the error becomes below a predetermined. Subsequently, the coordinates of the wafer center are again calculated.

If the registered pattern can not be found in the image received by the camera, the x-y stage is driven so that the camera receives an image of an area deviated from the current position in a direction perpendicular to a direction of a line connecting the current position and the wafer center, and the registered pattern is again searched. In the above operation, the x and y position are calculated again after the θ-error is corrected, because if the pattern matching method is performed with the existence of the θ-error, correct positions determination is difficult (the position of the above determined wafer center can contain a large error), even if it is possible to find the registered pattern.

At step 3, the x-y stage is driven so that the camera is opposed to the position $(X_5, Y_5)$ adjacent the marginal portion of the wafer adjacent to the opposite side.

At this position, similarly to the above described, the registered pattern is located, and the position is determined. On the basis of this measurement, the deformation, e.g., expansion of the wafer is calculated. Also, the θ-error is determined as an angle about the other marginal position $(X_3, Y_3)$. Until the θ-error becomes below a predetermined, the driving of the measurement are repeated. Subsequently, the position of the registered pattern is determined, and the coordinates of the wafer center is calculated again.

At Step 4, from the two sets of the wafer center coordinates determined adjacent opposite marginal portions, a final wafer center coordinates are calculated by compensating the error resulting from the deformation of the wafer.

The coordinates are used to move the x-y stage to the first chip to be inspected.

Here, it is added that the final automatic alignment is effected on the basis of the position measurements at two positions in the neighborhood of the wafer periphery, because the influence by a possible error in the θ-deviation measurement and an error in the wafer deformation measurement is minimized.

The deformation of the wafer thus obtained may be used for correcting the amount of step movement through the index, during the probing operation.

After the above processing, the chips of the wafer are sequentially inspected by stepwisely moving 0 the wafer in accordance with the wafer positioning information contained in the CPU 11 and on the basis of the results of the step 4.

The embodiment described in the foregoing may be modified in the scope of the present invention. For example, the embodiment has been described as employing an electrostatic capacity sensor 7 for the coarse alignment in the θ-direction, but a photosensor may be used in place of the electrostatic capacity sensor. Of course, without using the sensor 7, the orientation of the wafer 4 may be aligned by contacting rotatable members to the edge of the wafer 4. Additionally, the image recognizing means may be used for the coarse θ-alignment. In this case, it is preferable that the image magnification of the camera 8 is smaller than for the fine θ-alignment so that the camera 8 can cover a wider range. Then, a wider range can be compared by the image recognizing means 14 which produces x-deviation and y-deviation, from which the θ error can be corrected.

In the foregoing description of this embodiment, only one fine alignment in the θ-direction is performed, but two or more alignment operations may be performed depending on the position check after the θ-deviation correcting rotation which is dependent on the reliability of the θ-rotation by the wafer chuck.

As for reservation of the data of the template registration and the data of the registered positions, they may be stored in a back-up RAM or the like so as to reserve them when the electric power supply is stopped. Then, when the power is resupplied, the data may be transferred to the image recognizing means 14 from the back-up RAM. The alignment may be resumed without the necessity of starting from template registration. The template may be memorized in an external storing device such as a floppy disk or the like, so that it can be accessed as desired. In this case, the alignment operation can be carried out with no need of starting from the template registration.

Further, if the degree of coincidence between the template pattern and the detected pattern is not satisfactory as a result of the comparison by the image recognizing means 14, the chip can have a pattern which is different from the pattern registered from the monitored chip. Therefore, in that case, the stage may be moved through one or more integral multiples of the index, and the comparison is effected again.

Also, the present invention is not limited to the three-point measurements, but the measurement may be made at more than three positions to obtain the deformation (e.g., expansion) of the wafer in x and y directions. Then, the amounts of the indices in the x and y directions can be corrected.

While the invention has been described with reference to the structures disclosed herein, it is not confined to the details set forth and this application is intended to cover such modifications or changes as many come within the purposes of the improvements or the scope of the following claims.

What is claimed is:

1. An alignment method, comprising the steps of:
   taking an image of a first portion of a wafer by means of an image sensor;
   memorizing image data related to a pattern of the first portion and obtained by the image-taking by the image sensor;
   moving the wafer relative to the image sensor;
   taking, by means of the image sensor, an image of a second portion of the wafer, which second portion is closer to the first portion than is a third portion of the wafer;
   predicting the position of a pattern of the third portion on the bases of (i) the memorized image data related to the pattern of the first portion and (ii) image data related to a pattern of the second portion and obtained by the image-taking by the image sensor;
   moving the wafer relative to the image sensor on the basis of the prediction;
   taking an image of the third portion of the wafer by means of the image sensor; and
   detecting an error of the wafer in a rotational direction, on the basis of (i) the memorized image data related to the pattern of the first portion and (ii) image data related to the third portion and obtained by the image-taking by the image sensor.

2. A method according to claim 1, wherein the wafer has plural chips and wherein the first, second and third portions lie in different respective chips.

3. A method according to claim 1, further comprising the steps of rotationally moving the wafer to correct the detected error, taking an image of a desired portion of the wafer after the correction, and memorizing image data obtained by the image-taking as a template for pattern matching.

4. An alignment method, comprising the steps of:
   detecting a pattern of a first portion of a wafer and memorizing a result of the detection;
   detecting a pattern of a second portion of the wafer which portion is closer to the first portion than is a third portion of the wafer;
   predicting the position of a pattern of the third portion of the wafer on the basis of (i) the memorized result of detection of the pattern of the first portion and (ii) a result of detection of the pattern of the second portion;
   moving the wafer on the basis of the prediction;
   detecting a pattern of the third portion of the wafer;
   detecting an error of the wafer in a rotational direction, on the basis of (i) the memorized result of detection of the pattern of the first portion and (ii) a result of detection of the pattern of the third portion; and
   rotationally moving the wafer to correct the detected error.

5. A method according to claim 4, wherein the wafer has plural chips and wherein the first, second and third portions lie in respective chips.

6. A method according to claim 4, further comprising the steps of taking an image of a desired portion of the wafer after the correction and memorizing image data obtained by the image-taking as a template for pattern matching.

7. An alignment device, comprising:
   first detecting means;
   driving means for moving a wafer relative to said first detecting means;

memorizing means for memorizing data related to a pattern of a first portion of the wafer detected by said first detecting means;

predicting means for predicting, on the basis of (i) the data related to the pattern of the first portion of the wafer and memorized in said memorizing means and (ii) data related to a pattern of a second portion of the wafer detected by said first detecting means, the position of a pattern of the third portion of the water, wherein the second portion is closer to the first portion than is the third portion;

controlling means for controlling said driving means on the basis of the prediction; and second detecting means for detecting an error of the wafer in a rotational direction on the basis of (i) the data related to the pattern of the first portion of the wafer and memorized in said memorizing means and (ii) data related to the pattern of the third portion detected by said first detecting means.

8. A device according to claim 7, wherein said driving means includes a first driving system for moving the wafer in each of X and Y directions and a second driving system for moving the wafer in the rotational direction, wherein said controlling means controls said first driving system on the basis of the prediction and controls said second driving system on the basis of the detected error.

9. A device according to claim 8, wherein said first detecting means detects a desired portion of the wafer for preparing a template for pattern matching, after the error of the wafer in the rotational direction is corrected by said second driving system.

10. An alignment method, comprising the steps of:

moving a wafer by means of an X-Y stage to allow a pattern of a first portion of the wafer adjacent to a center thereof to be detected by a detector;

detecting, by means of the detector, the pattern of the first portion of the wafer to detect a positional error of the wafer;

moving the wafer by means of the X-Y stage to allow a pattern of a second portion of the wafer adjacent to an outer periphery thereof to be detected by the detector, to correct the positional error detected by using the pattern of the first portion of the wafer;

detecting, by means of the detector, the pattern of the second portion of the wafer, to detect a rotational error of the wafer;

rotationally moving the wafer by means of a $\theta$-stage to bring the rotational error detected by using the pattern of the second portion into a predetermined state and, thereafter, detecting the pattern of the second portion by means of the detector to detect a positional error of the wafer;

moving the wafer by means of the X-Y stage to allow a pattern of a third portion of the wafer, which portion is adjacent to the outer periphery of the wafer and which is substantially on a side of the second portion away from the first portion, to be detected by the detector;

detecting, by means of the detector, the pattern of the third portion of the wafer to detect a rotational error of the wafer;

rotationally moving the wafer by means of the $\theta$-stage to bring the rotational error detected by using the pattern of the third portion of the wafer into a predetermined state and, thereafter, detecting the pattern of the third portion of the wafer through the detector to detect a positional error of the wafer; and controlling the movement of the wafer by means of the X-Y stage on the basis of the positional error detected by using the patterns of the second and third portions.

11. A method according to claim 10, wherein the X-Y stage moves the wafer to allow the pattern of the third portion of the wafer to be detected by the detector with the positional error, detected by using the pattern of the second portion, being corrected.

12. A method according to claim 10, wherein the detector includes an image sensor.

* * * * *

UNITED STATES PATENT AND TRADEMARK OFFICE
CERTIFICATE OF CORRECTION

Page 1 of 2

PATENT NO. : 4,870,288
DATED : September 26, 1989
INVENTOR(S) : YUJI ABUKU, ET AL.

It is certified that error appears in the above-identified patent and that said Letters Patent is hereby corrected as shown below:

Title page:

IN [30] FOREIGN APPLICATION PRIORITY DATA

Insert: --March 19, 1987 [JP] Japan ....... 62-062736--.

COLUMN 1

Line 13, "displays" should read --displays,--.

COLUMN 3

Line 19, "control programs" should read
    --control program--.
    Line 49, "th" should read --the--.

COLUMN 4

Line 48, "positron" should read --position--.

COLUMN 5

Line 48, "firs" should read --first--.

COLUMN 8

Line 39, "position" should read --positions--.
    Line 61, "a" should be deleted.

COLUMN 9

Line 8, "stepwisely moving 0" should read
    --stepwisely moving--.

UNITED STATES PATENT AND TRADEMARK OFFICE
CERTIFICATE OF CORRECTION

PATENT NO. : 4,870,288

DATED : September 26, 1989

INVENTOR(S) : YUJI ABUKU, ET AL.

It is certified that error appears in the above-identified patent and that said Letters Patent is hereby corrected as shown below:

COLUMN 10

Line 13, "bases" should read --basis--.

COLUMN 11

Line 10, "water," should read --wafer,--.

Signed and Sealed this

Thirteenth Day of October, 1992

Attest:

DOUGLAS B. COMER

*Attesting Officer*  Acting Commissioner of Patents and Trademarks